(12) United States Patent
Motoi et al.

(10) Patent No.: US 6,480,016 B1
(45) Date of Patent: Nov. 12, 2002

(54) TESTER, A TEST SYSTEM, AND A TESTING METHOD FOR A SEMICONDUCTOR INTEGRATED CIRCUIT

(75) Inventors: Shinji Motoi, Tokyo (JP); Kazuhiro Nishimura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 48 days.

(21) Appl. No.: 09/645,505

(22) Filed: Aug. 25, 2000

(30) Foreign Application Priority Data

Mar. 1, 2000 (JP) .......................... 2000-055531

(51) Int. Cl.[7] .......................... G01R 31/26; G01R 1/28; G06F 11/00
(52) U.S. Cl. .................. 324/765; 324/158.1; 714/735; 714/736
(58) Field of Search ................. 324/111, 765, 324/158.1, 76.61; 714/735, 736; 327/63, 72

(56) References Cited

U.S. PATENT DOCUMENTS

| | | | |
|---|---|---|---|
| 3,924,109 A | * 12/1975 | Jhu et al. ................. 714/734 |
| 5,590,137 A | * 12/1996 | Yamashita ................ 324/158.1 |
| 5,701,309 A | 12/1997 | Gearhardt et al. .......... 371/25.1 |
| 6,157,200 A | * 12/2000 | Okayasu .................... 324/753 |
| 6,163,864 A | * 12/2000 | Bhavsar .................... 714/727 |
| 6,243,841 B1 | * 6/2001 | Mydill ....................... 714/724 |

FOREIGN PATENT DOCUMENTS

| JP | 6-213964 | 8/1994 |
|---|---|---|
| JP | 8-129052 | 5/1996 |

* cited by examiner

*Primary Examiner*—N. Le
*Assistant Examiner*—Anjan K. Deb
(74) *Attorney, Agent, or Firm*—Leydig, Voit & Mayer, Ltd.

(57) ABSTRACT

An input signal for testing a device is stored in a first storage located on a test board. An expectation value signal output by the device, when it operates normally, in response to the input signal is stored in a second storage located on the same test board. The input signal from the first storage is supplied to the device based on an instruction from a tester body. The device outputs an output signal in response to input of this input signal. This signal is sent to a comparator. The comparator compares the signal output from the device with the expectation value signal stored in and output from the second storage.

5 Claims, 5 Drawing Sheets

TESTER, A TEST SYSTEM, AND A TESTING METHOD FOR A SEMICONDUCTOR INTEGRATED CIRCUIT

FIELD OF THE INVENTION

The present invention relates to a test on a semiconductor integrated circuit and, more particularly, to a test which can be conducted on a large scale semiconductor integrated circuit without using a high-performance tester body having a memory for a large capacity.

BACKGROUND OF THE INVENTION

A test on an ordinary semiconductor integrated circuit (IC) is carried out as follows. Continuous digital signals (input pattern) at the H (High) or L (Low) level are supplied from the tester body of a semiconductor tester to a device to be tested. It is then determined whether or not continuous digital signals at the H or L level (output pattern) as expected in correspondence with the level of the input signals are outputted from the device.

FIG. 5 shows an example of a conventional test system for a semiconductor integrated circuit. A tester body 501 is a semiconductor testing apparatus and supplies continuous digital signals at either the H or L level (input pattern) via a signal line 504 to a device 503 to be tested (which is a semiconductor integrated circuit) and placed on a test board 502. The tester body 501 receives continuous digital signals at either the H or L level (output pattern) output by the device 503 in correspondence with the input signals. The tester body 501 then determines whether or not the signals are as they are expected to be.

A memory for storing the input and output patterns used for testing the device to be tested is provided in the tester body 501.

Since the scale and packing density of the present day semiconductor integrated circuits (device 503 to be tested) is increasing, the number of input and output patterns used for tests is also increasing. Accordingly, it is becoming difficult day by day to carry out a test using a cheap tester body 501 having only a limited memory capacity.

Especially, in the case of carrying out a test by using a long serial pattern typified by a scan system, it is necessary to store not only data of a signal line which changes but also data of a signal line which does not change. A very large memory capacity or an optional function dedicated to a serial test is therefore necessary.

SUMMARY OF THE INVENTION

It is the object of the present invention to provide a testing method capable of performing a test using a long serial pattern typified by a scan method using a cheap tester body having a limited memory capacity without requiring an optional function dedicated to a serial test.

A tester according to one aspect of this invention comprises a first storage which stores an input signal for testing a device to be tested; a second storage which stores an expectation value signal output when the device normally operates in response to the input signal; and a comparator which compares the expectation value signal from the second storage with an actual output signal from the device. The first storage, the second storage, and the comparator are provided on a test board.

Further, the first and second storages are non-volatile memories. The tester further comprises a first high-speed storage for reading the input signal for test from the first storage and transmitting the read input signal to the device; and a second high-speed storage for reading the expectation value signal from the second storage and transmitting the read signal to the comparator.

A test system according to another aspect of this invention comprises a first storage which stores an input signal for testing a device to be tested; and a second storage which stores an expectation value signal which is output when the device normally operates in response to the input signal. A memory in the device is used for temporarily storing both the input signal for test from the first storage and the expectation value signal from the second storage. The expectation value signal is compared with an actual output signal from the device.

Further, the tester and test system further comprises a first level-varying unit capable of varying the level of an input signal to the device; and a second level-varying unit capable of varying a threshold level of an output signal from the device.

A method of testing a semiconductor integrated circuit according to still another aspect of this invention comprises the steps of storing an input signal for testing a device to be tested into a first storage; storing an expectation value signal which is output when the device normally operates in response to the input signal into a second storage; inputting the input signal for testing from the first storage into the device; and comparing an output signal output from the device with the expectation value signal from the second storage.

Other objects and features of this invention will become apparent from the following description with reference to the accompanying drawings.

DESCRIPTION OF THE PREFERRED EMBODIMENTS

Figure 1:
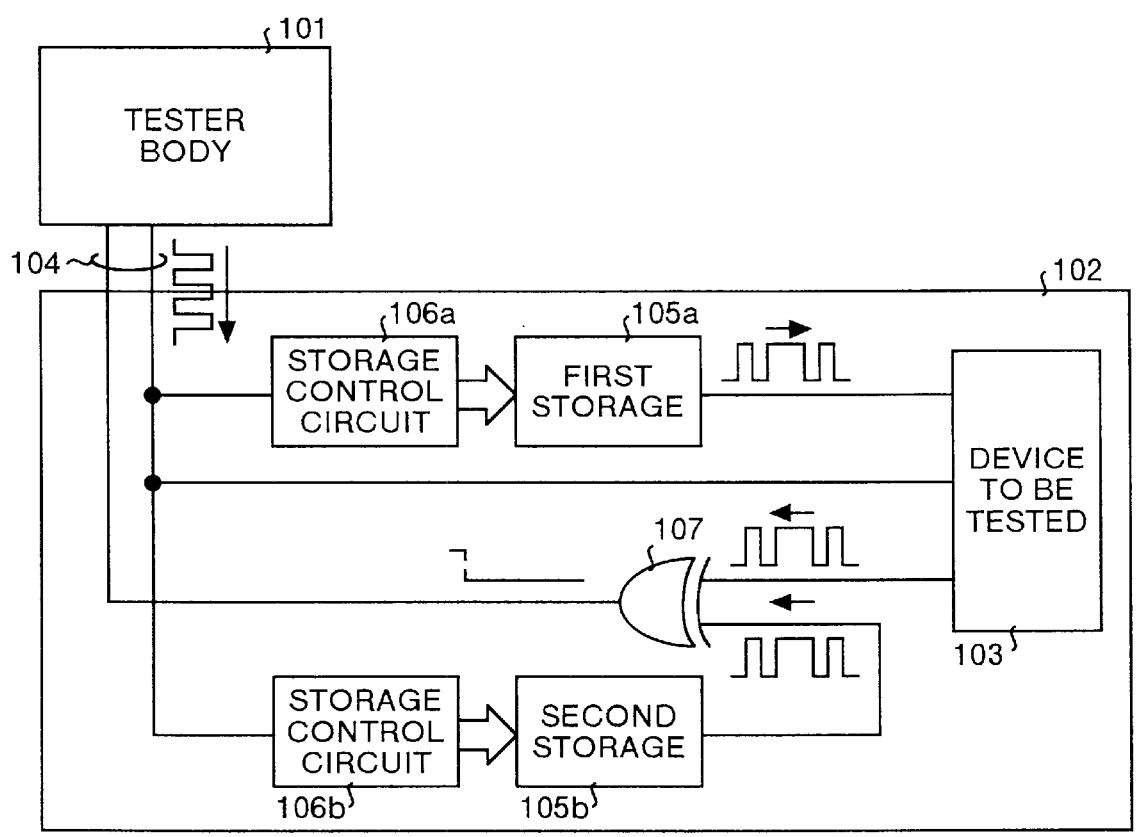
FIG. 1 is a block diagram showing a tester for a semiconductor integrated circuit according a first embodiment of the invention.

FIG. 1 is a block diagram showing a tester for a semiconductor integrated circuit according to a first embodiment of the invention. A tester body 101 is used for testing and evaluating a device to be tested (that is, a semiconductor integrated circuit). The tester body 101 transmits/receives various signals to/from a device 103 to be tested which is placed on a test board 102 and a measuring circuit which is provided on the test board 102 through signal lines 104. The measuring circuit will be described later. A first storage 105a stores an input signal for testing (input pattern) to be applied to the device 103. The first storage 105a is a non-volatile ROM (EPROM, EEPROM or flash memory) or the like. The first storage 105a supplies a test signal to a specific input or output terminal of the device 103 under the control of the tester body 101.

A second storage 105b stores an expectation value signal. The expectation value signal is the same as a signal which is output from the specific terminal when the device 103 operates normally in response to the test input signal supplied from the first storage 105a. The second storage 105b is a non-volatile ROM or the like.

Storage control circuits 106a and 106b are circuits such as address counters for controlling the first and second storages 105a and 105b, respectively. A comparator 107 plays the role of comparing the output signal of the device 103 with an output signal of the second storage 105b and supplying the result to the tester body 101. In this first embodiment, the comparator 107 functions as an exclusive OR (EXOR) circuit.

A part from the above mentioned components, a power source for supplying a power to the device 103 to be tested, a signal line connected to other output terminals, and the like are necessary. For simplicity of explanation, they are omitted here.

The operation of the embodiment will now be described. A test start signal is transmitted from the tester body 101 to the device 103, the storage control circuits 106a, and 106b. Accordingly, the device 103 and the test board 102 enter a test mode. Synchronously with a clock from the tester body 101, an input signal for testing (input pattern) is read from the first storage 105a via the storage control circuit 106a and is supplied to a specific terminal of the device 103 at a predetermined timing. An output signal (output pattern) in response to the input signal (input pattern) is output from a specific terminal of the device 103 to the comparator 107. On the other hand, synchronously with the clock from the test body 101, an expectation value signal (expectation value pattern) corresponding to the input signal is output from the second storage 105b to the comparator 107 via the storage control circuit 106b. The two signals (output pattern and expectation value pattern) are compared with each other by the comparator 107 and a comparison result is sent to the tester body 101.

In this first embodiment, the comparator 107 functions an exclusive OR circuit. When the device 103 operates normally, if the output of the comparator 107 is sampled in a cycle synchronous with the clock of the tester body 101 then all of values will be at the L level. When the device 103 is defective, a part or all of the values will be at the H level.

Thus, it is sufficient for the tester body 101 to repeat an operation of determining the expectation value to be at L level.

According to the first embodiment, even if the tester body does not have a pattern memory of a large capacity like in the conventional tester, there is an advantage that a long pattern can be used for a test.

Further, particularly in a test such as a scan test in which the number of terminals at which input data and output data change is small, a great effect can be produced.

Although a ROM is used as each of the storages 105a and 105b in the foregoing embodiment, it is also possible to use a RAM and write data from the tester body 101 into this RAM.

Figure 2:
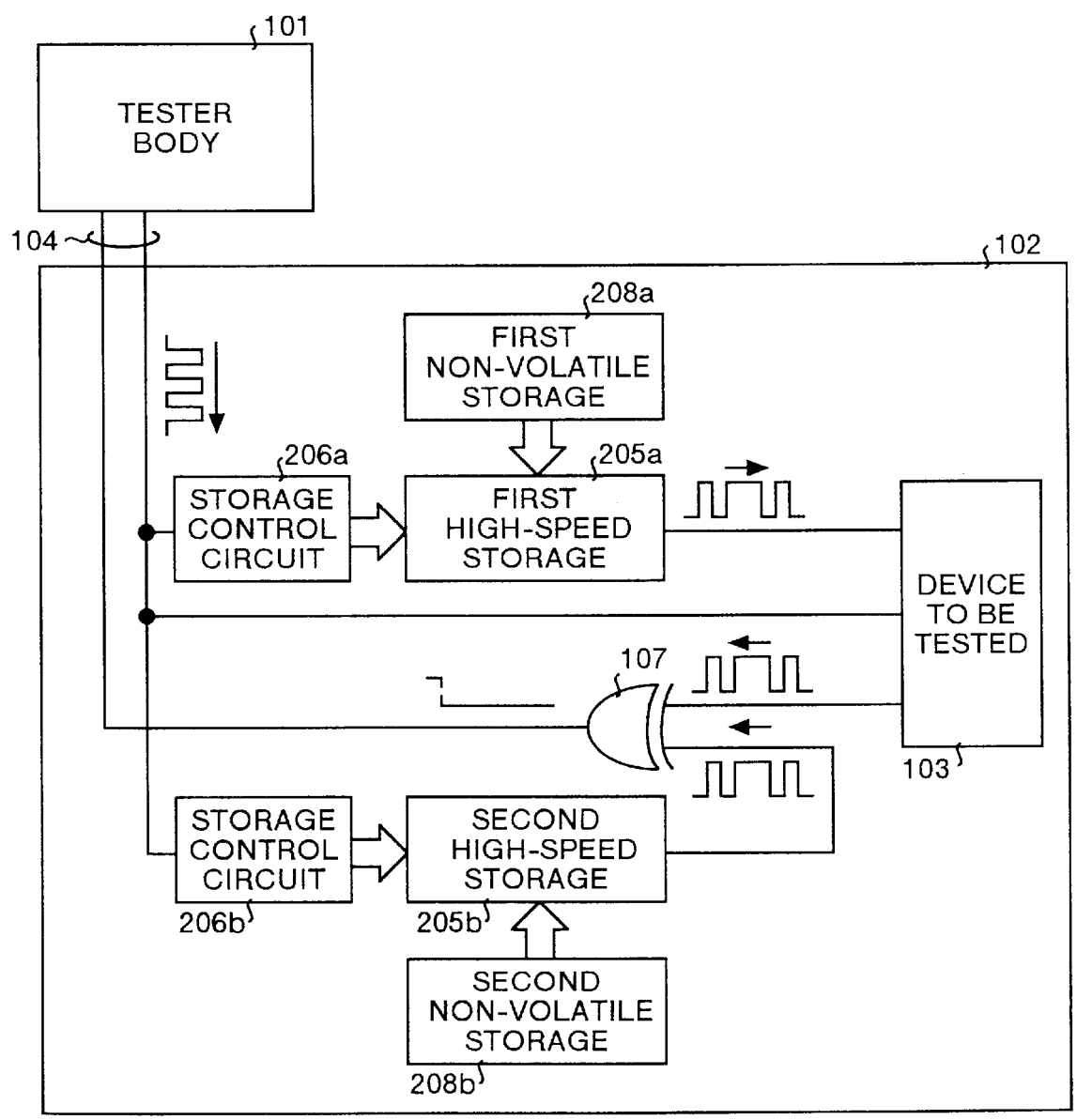
FIG. 2 is a block diagram showing a tester for a semiconductor integrated circuit according to a second embodiment of the invention.

FIG. 2 is a block diagram showing a tester for a semiconductor integrated circuit according to a second embodiment of the invention. First high-speed storage 205a is a memory which can be accessed at high speed and stores the input signal (input pattern) to be applied to the device 103 to be tested which is provided on the test board 102. For example, a volatile high-speed RAM or the like may be used as the first high-speed storage 205a. A first non-volatile storage 208a is, for example, a non-volatile memory (EPROM, EEPROM, flash memory, or the like) and stores the input signal (input pattern) to be applied to the device 103. The stored data is transferred to the first high-speed storage 205a when required.

Second high-speed storage 205b is a memory for transmitting an expectation value signal to the comparator 107. The expectation value signal is the same as a signal which is output from a specific terminal of the device 103 when the device operates normally in response to a test signal transmitted from the first high-speed storage 205a to the device 103. For example, high-speed volatile RAM may be used as the second high-speed storage 205b. The second non-volatile storage 208b is, for instance, a non-volatile ROM which stores the expectation value signal. The data stored in the second non-volatile storage 208b is transferred to the second high-speed storage 205b when required.

According to this second embodiment, the input pattern is supplied to the device 103 and the output pattern is read from the device 103 by using the high-speed storages 205a and 205b which are high-speed volatile RAMs or the like. Consequently, a test can be easily carried out at a high-speed.

Figure 3:
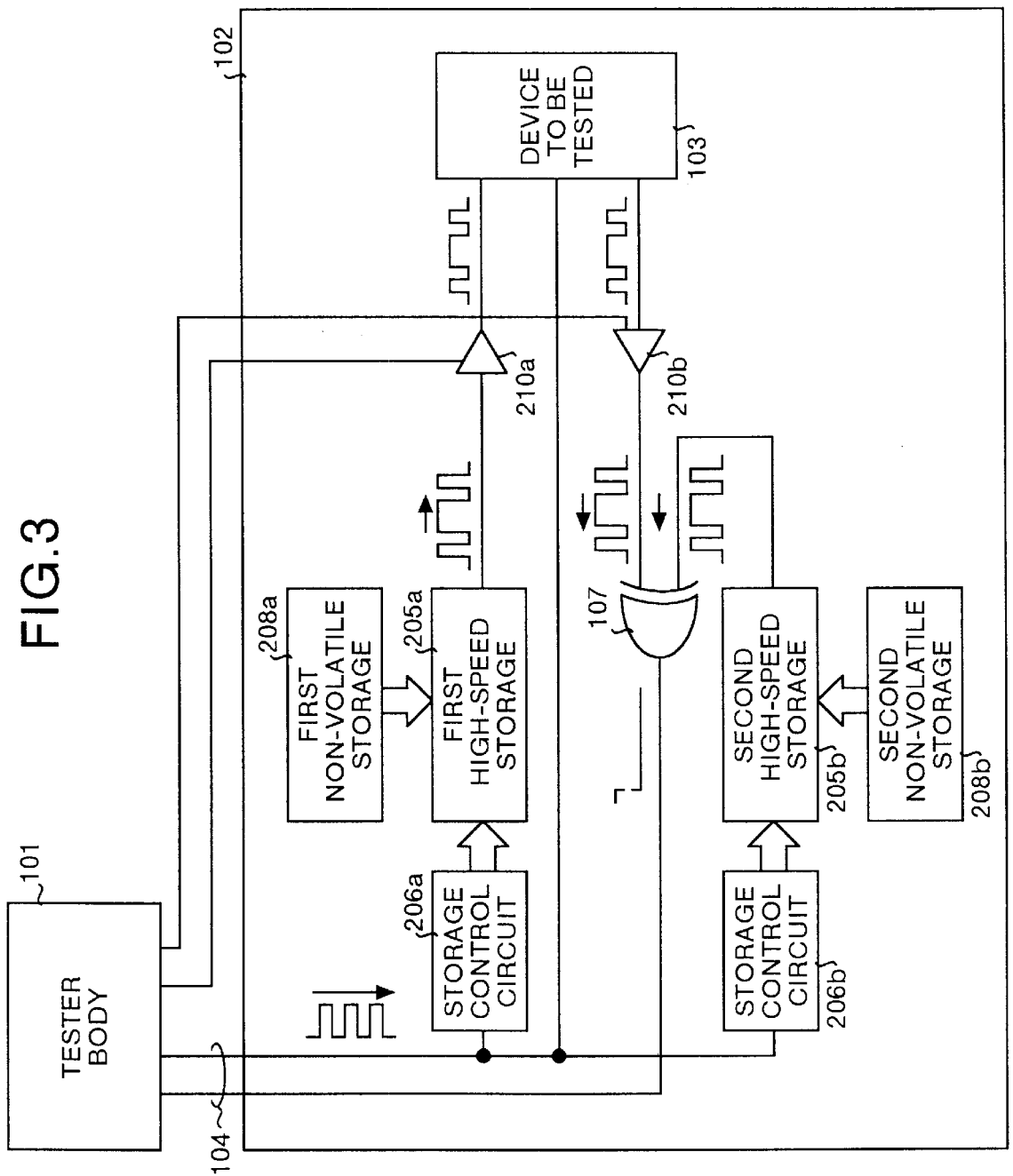
FIG. 3 is a block diagram showing a tester for a semiconductor integrated circuit according to a third embodiment of the invention.

FIG. 3 is a block diagram showing a tester for a semiconductor integrated circuit according to a third embodiment of the invention. Buffer 210a (level varying means) capable of varying an output voltage from the first high-speed storage 205a is interposed between the first high-speed storage 205a and the test signal input terminal of the device 103. Further, a comparator 210b (level varying means) capable of varying a threshold level of a specific output of the device 103 is connected between the test signal output terminal of the device 103 and the comparator 107.

According to this third embodiment, a test can be carried out even when the level of an input/output signal is regulated due to, for example, a change in the specification of the power source of the device to be tested.

Figure 4:
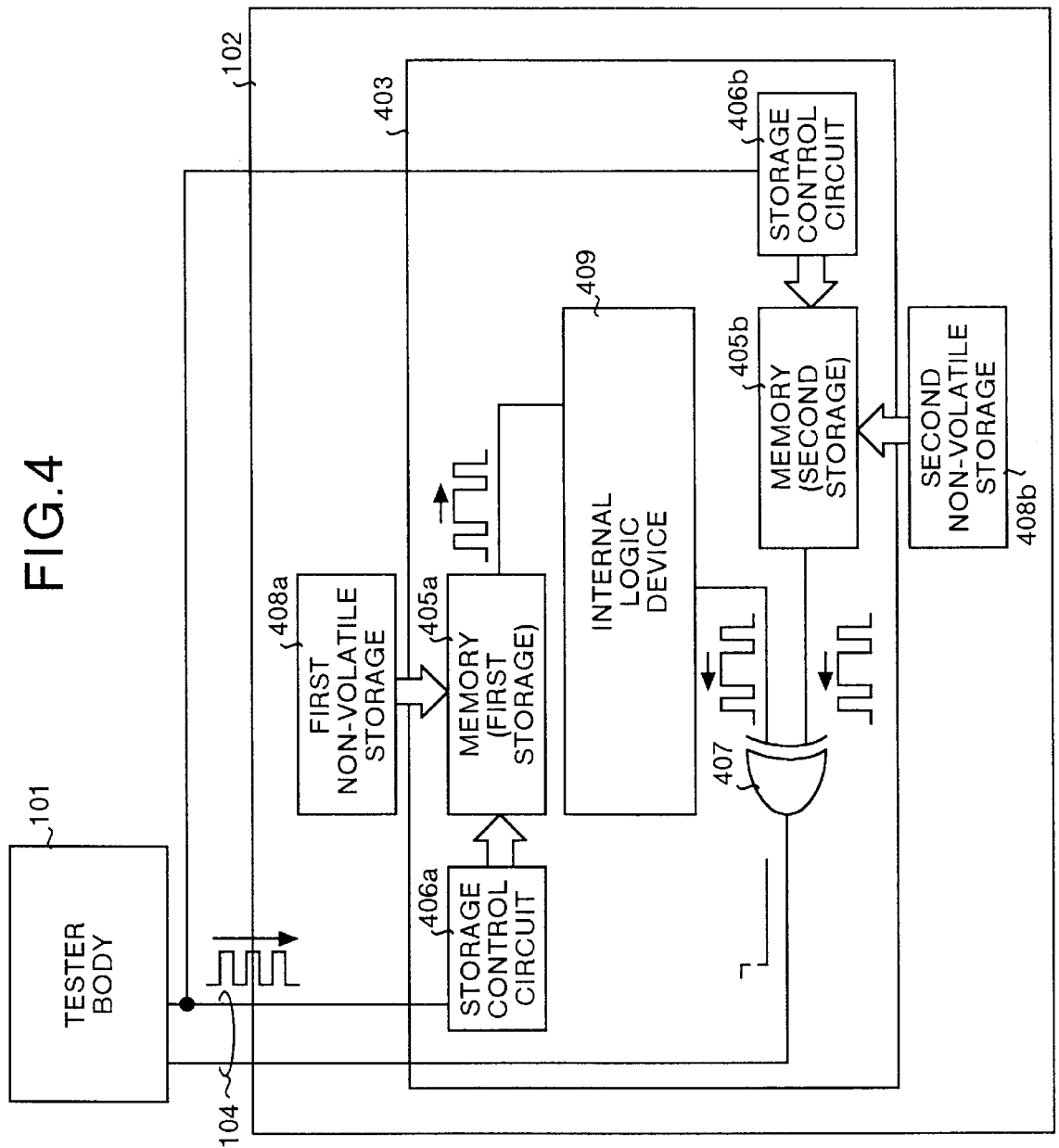
FIG. 4 is a block diagram showing a tester for a semiconductor integrated circuit according to a fourth embodiment of the invention.
Figure 5:
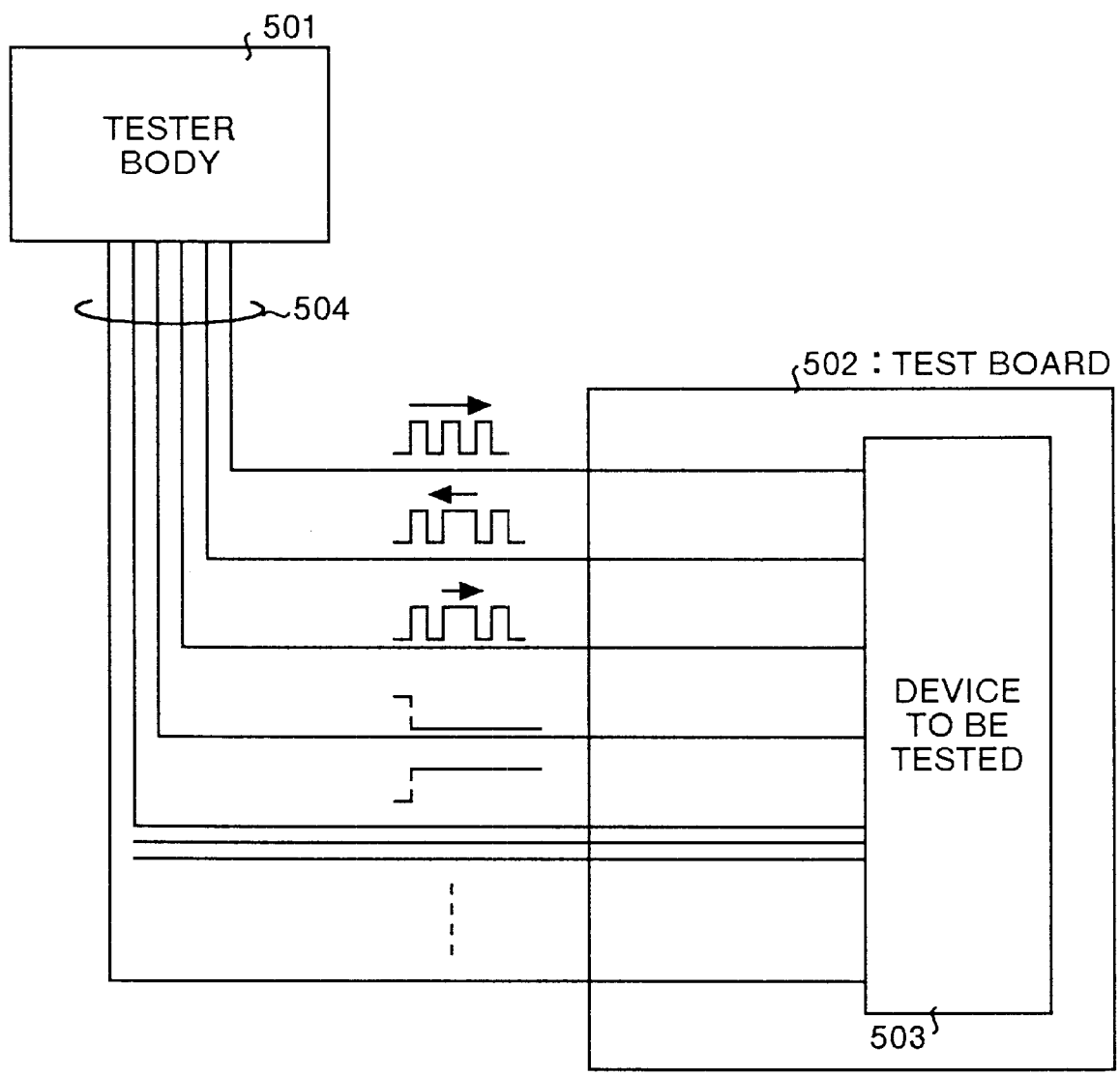
FIG. 5 is a block diagram showing an example of a conventional test system for a semiconductor integrated circuit.

FIG. 4 is a block diagram showing a tester for a semiconductor integrated circuit according to a fourth embodiment of the invention. Device 403 to be tested, which is placed on the test board 102, comprises an internal logic device 409 and at least two memories 405a and 405b. The memory 405a also functions as the first storage for storing the test input signal to be input into a specific node of the internal logic device 409 in the device 403. For example, a high-speed volatile RAM or the like maybe used as the memory 405a. A first non-volatile storage 408a is provided on the test board 402 and stores the test input signal (input pattern) to be supplied to a specific node of the internal logic device 409 in the device 403. The data stored in the first non-volatile storage 408a is transferred to the memory 405a when required.

The memory 405b has the function of sending the expectation value signal to a comparator 407. The expectation value signal is the same as a signal output from a specific node of the internal logic device 409, when it normally operates, in response to a test signal sent from the memory 405a to the internal logic device 409 in the device 403. For example, a high-speed volatile RAM may be used as the memory 405b. The second non-volatile storage 408b is provided on the test board 402 and is, for example, a non-volatile ROM which stores the expectation value signal.

The data stored in the second non-volatile storage 408*b* is transferred to the memory 405*b* when required.

According to this forth embodiment, even if the memory for test is not particularly provided in the device to be tested, a part of the internal memory formed as a part of the functions of the device to be tested can be used as a memory for test.

As described above, according to one aspect of this invention, the input signal for testing the device to be tested is stored into the first storage on the test board, the expectation value signal which is output when the device normally operates in response to the input signal is stored into the second storage on the test board, the test input signal is supplied from the first storage to the device, and an output signal output from the device is compared with the expectation value signal from the second storage. Consequently, there is an effect such that, even if the tester body does not have the pattern memory of a large capacity, a test can be conducted by using a long pattern. It is especially effective on a test such as a scan test in which the number of terminals at which input data and output data changes is small.

Especially, the first and second storages are non-volatile. The tester further comprises the first high-speed storage for reading the input signal for test from the first storage and transmitting the read input signal to the device; and the second high-speed storage for reading the expectation value signal from the second storage and transmitting the read signal to the comparator. Therefore, the input signal can be output at high speed and the output signal can be read at high speed to/from the device. That is, test can be realized at high-speed.

According to another aspect of this invention, the test system for a semiconductor integrated circuit comprises the first storage which is provided on the test board and stores the input signal for testing a device to be tested; and the second storage which is provided on the test board and stores the expectation value signal which is output when the device normally operates in response to the input signal. The memory in the device is used for temporarily storing both the input signal for test from the first storage and the expectation value signal from the second storage. The expectation value signal is compared with a signal actually output from the device. Consequently, even if a memory dedicated to tests is not provided in the device, a part of the memory formed on the inside as a part of the functions of the device to be tested can be used as a memory for test.

Further, the tester or the test system comprises the first level-varying unit capable of varying the level of an input signal to the device; and the second level-varying unit capable of varying a threshold level of an output signal from the device. Consequently, the following effect is produced. Even if, for example, a specification of the power source of the device to be tested changes and the levels of the input/output signals are regulated, a test can be carried out.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A tester for testing a semiconductor integrated circuit, said tester comprising:
   a tester body generating a clock signal and sampling an output signal, synchronous with the clock signal, to determine whether a semiconductor integrated circuit being tested is defective; and
   a plurality of test boards selectively connectable to the tester body, each test board including
      a first memory storing an input signal for testing a specific semiconductor integrated circuit;
      a second memory storing an expectation value signal expected to be output by the specific semiconductor integrated circuit when the specific semiconductor integrated circuit operates normally, in response to input of the input signal for testing to the specific semiconductor integrated circuit; and
      a comparator for comparing the expectation value signal output from said second memory with a signal actually output by the specific semiconductor integrated circuit, and outputting a comparison signal to the tester body for determination, by the tester body, whether the specific semiconductor integrated circuit is defective, regardless of which test board is connected to the tester body.

2. The tester according to claim 1, wherein said first and second memories are non-volatile, and at least some of said test boards further comprise:
   a first high-speed memory which reads the input signal for testing from said first memory and transmits the input signal for testing read to the specific semiconductor integrated circuit; and
   a second high-speed memory which reads the expectation value signal from said second memory and transmits the expectation value signal read to said comparator.

3. The tester according to claim 1, wherein at least some of the test boards comprise:
   a first level-varying unit varying level of the input signal for testing to be input to the specific semiconductor integrated circuit; and
   a second level-varying unit varying a threshold level of a signal output by the specific semiconductor integrated circuit.

4. A test system for testing a semiconductor integrated circuit, said system comprising:
   a tester body generating a clock signal and sampling an output signal, synchronous with the clock signal, to determine whether a semiconductor integrated circuit being tested is defective; and
   a plurality of test boards selectively connectable to the tester body, each test board including
      a first memory storing an input signal for testing a specific semiconductor integrated circuit; and
      a second memory storing an expectation value signal expected to be output by the specific semiconductor integrated circuit when the specific semiconductor integrated circuit operates normally, in response to input of the input signal for testing to the specific semiconductor integrated circuit, wherein
         a memory of the specific semiconductor integrated circuit is used for temporarily storing both the input signal for testing from said first memory and the expectation value signal from said second memory; and the expectation value signal is compared with a signal actually output by the specific semiconductor integrated circuit, and a comparison signal is output to the tester body for determination, by the tester body, whether the specific semiconductor integrated circuit is defective, regardless of which test board is connected to the tester body.

5. The test system according to claim 4, wherein at least some of the test boards comprise:

a first level-varying unit varying level of the input signal for testing to be input to the specific semiconductor integrated circuit; and a second level-varying unit varying a threshold level of a signal output by the specific semiconductor integrated circuit.

* * * * *